US006258639B1

(12) United States Patent
Rohdin et al.

(10) Patent No.: US 6,258,639 B1
(45) Date of Patent: Jul. 10, 2001

(54) SINTERED GATE SCHOTTKY BARRIER FET PASSIVATED BY A DEGRADATION-STOP LAYER

(75) Inventors: Hans Rohdin, Los Altos; Chung-Yi Su, Fremont; Arlene Sachiyo Wakita-Oyama, Palo Alto; Nicolas J. Moll, La Honda, all of CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/316,171

(22) Filed: May 21, 1999

(51) Int. Cl.$^7$ .................................................. H01L 21/338
(52) U.S. Cl. ........................... 438/167; 438/121; 438/175; 438/430; 438/581; 257/190; 257/194; 257/283; 257/280
(58) Field of Search ....................................... 257/190, 194, 257/283, 280, 472; 438/167, 121, 21, 95, 175, 581, 430

(56) References Cited

U.S. PATENT DOCUMENTS 5,172,197 * 12/1992 Nguyen et al. ........................ 357/22

OTHER PUBLICATIONS

H. Rohdin, A. Nagy, V. Robbins, C–Y. Su, A.S. Wakita, J. Seeger, T. Hwang, P. Chye, P.E. Gregory, S.R. Bahl, F.G. Kellert, L.G. Studebaker, D.C. D'Avanzo, and S. Johnsen, "0.1–μm Gate–Length AllnAs/GaInAs/GaAs MODFET MMIC Process for Applications in High–Speed Wireless Communications", The Hewlett–Packard Journal, Dec., 1997.

H. Rohdin, A. Nagy, V. Robbins, C–Y. Su, C. Madden, A. Wakita, J. Raggio, and J. Seeger, "Low–Noise, High–Speed Ga47In53As/Al48In52As 0.1 –μm MODFETs and High-Gain/Bandwidth Three–Stage Amplifier Fabricated on GaAs Substrate", IEEE 7th International Conference on Indium Phosphide and Related Materials, 1995.

(List continued on next page.)

Primary Examiner—Matthew Smith
Assistant Examiner—Igwe U. Anya

(57) ABSTRACT

A transistor structure with a degradation-stop layer that prevents degradation of underlying semiconductor layers while minimizing any increase in the gate leakage current is disclosed. In one embodiment, a transistor structure includes: a substrate; a channel layer formed of a charge transport material over the substrate; a Schottky barrier layer formed of an aluminum-containing material over the channel layer; a degradation-stop layer formed of a substantially aluminum-free material over the Schottky barrier layer; and a source, a drain and a gate. The source and the drain being formed over or alloyed through the degradation-stop layer, and a lower portion of the gate extends down through an exposed portion of the degradation-stop layer and is in physical and electrical contact with the Schottky barrier layer.

20 Claims, 2 Drawing Sheets

OTHER PUBLICATIONS

H. Rohdin, C–Y. Su, N. Moll, A. Wakita, A. Nagy, V. Robbins, and M. Kauffman "Semi–Analyticial Analysis for Optimization of 0.1 –$\mu$m InGaAs–Channel MODFETs with Emphasis on On–State Breakdown and Reliability", IEEE 9th International Conference on Indium Phosphide and Related Materials, 1997.

T. Sonoda, Y. Yamamoto, N. Hayafuji, H. Yoshida, H. Sasaki, T, Kitano, S. Takamiya, and M. Ostubo, "Manufacturability and Reliability if InP HMETs", Solid–State Electronics, vol. 41, No. 10, pp. 1621–1628, 1997.

K.J. Chen, T. Enoki, K. Maezawa, K. Arai, and M. Yamamoto, "High–Performance Enhancement–Mode InAIAs/InGaAs HEMT's Using Non–Alloyed Ohmic Contact and Pt–Based Buried–Gate", Proc. InP Rel. Mater., 1996, p. 428–431.

Amano, M, et al., "InAIAs/InGaAs HEMT using UbGaP Schottky Contact Layer", Seventh International Conference on Indium Phosphide and Related Materials, Japan Society of Applied Physics, May 9–13, 1995, Sapporo, Japan, pp. 416–419.

A.S. Wakita, H. Rohdin, C–Y Su, N. Moll, A. Nagy, and V.M. Robbins, "Drain Resistance Degradation Under High Fields in allnAs/GaInAs MODFETs", IEEE 9th International Conference on Indium Phosphide and Related Materials, 1997.*

A.S. Wakita, H. Rohdin, V.M. Robbins, N. Moll, C–Y. Su, A. Nagy, and D.P. Basile, "Low–Noise Bias Reliability of AllnAs/GaInAs MODFETs with Linearly Graded LowTemperature Buffer Layers Grown on GaAs Substrates", IEEE 10th International Conference on Indium Phosphide and Related Materials, 1998.*

H. Rohdin, A. Wakita, A, Nagy, V. Robbins, N. Moll, and C–Y. Su, "A 0.1 –$\mu$m MHEMT Millimeter–Wave IC Technology Designed for Manufacturability", Special TWHM–ISA '98 Issue of Solid–State Electronics, Sept., 1998.*

* cited by examiner

SINTERED GATE SCHOTTKY BARRIER FET PASSIVATED BY A DEGRADATION-STOP LAYER

TECHNICAL FIELD

The present invention relates generally to semiconductors and more specifically to field effect transistors.

BACKGROUND ART

A high electron mobility field-effect transistor (HEMT), or modulation-doped field effect transistor (MODFET), is an extremely fast transistor device that is used in high-speed monolithic microwave integrated circuits (MMICs). Applications for HEMTs include wireless millimeter-wave communications, fiber-radio personal communication systems, automobile collision-avoidance radar, and optical fiber and low-noise direct broadcast satellite (DBS) communications receivers.

A typical HEMT includes a Schottky barrier layer overlying a donor layer, both of which are typically formed of a wide band-gap semiconductor such as an aluminum-containing material. Exposure of the Schottky barrier layer, the semiconductor surface, or the donor layer, to impurities during the fabrication process or during the normal operation of the HEMT can result in the degradation of the semiconductor surface of the Schottky barrier and/or the underlying donor layer. This adversely affects the performance and the reliability of the HEMT.

It should be noted that the term "degradation" is used herein and applies to oxidation, fluorine passivation, and other forms of deterioration due to the presence of impurities.

Various solutions to these degradation problems have been proposed. Most of the solutions typically involve the use of one or more thin epitaxial layers of an aluminum-free semiconductor as "stop layers" to prevent degradation of the Schottky barrier layer and/or the underlying donor layer. For example, U.S. Pat. No. 5,172,197 to Nguyen et al. describes the use of a passivation or stop layer of a lattice-matched, non-oxidizable material forned underlying the source, drain, and gate, and sealingly overlying the donor layer. One drawback of these alternative solutions is that the stop layer tends to increase the gate leakage current, which is undesirable for a good Schottky barrier layer, and adversely affects the electrical performance of the HEMT. A solution, which would prevent degradation of the Schotily barrier layer and/or the donor layer while minimizing any increase in the gate leakage current, has been long sought but has eluded those skilled in the art. As the semiconductor industry is moving to even higher speed applications, it is becoming more pressing that a solution be found.

DISCLOSURE OF THE INVENTION

The present invention provides a trrnsistor structure with enhanced electrical performance and improved reliability.

The present invention further provides a transistor structure with a degradation-stop layer that prevents degradation of underlying semiconductor layers while minimizing any increase in the gate leakage current.

The present invention still fer provides a transistor structure that includes a substrate, a channel layer formed of a charge transport material over the substrate, a Schottky barrier layer formed of an aluminum-containing material over the channel layer, a degradation-stop layer formed of a substantially aluminum-free material over the Schottky barrier layer, and source, drain and gate. The source and the drain are formed in association with the degradation-stop layer. A lower portion of the gate extends down through an exposed portion of the degradation-stop layer and is in physical and electrical contact with the Schottky barrier layer.

The present invention further provides a method for forming a transistor with a degradation-stop layer that prevents degradation of underlying semiconductor layers while minimizing any increase in the gate leakage current.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
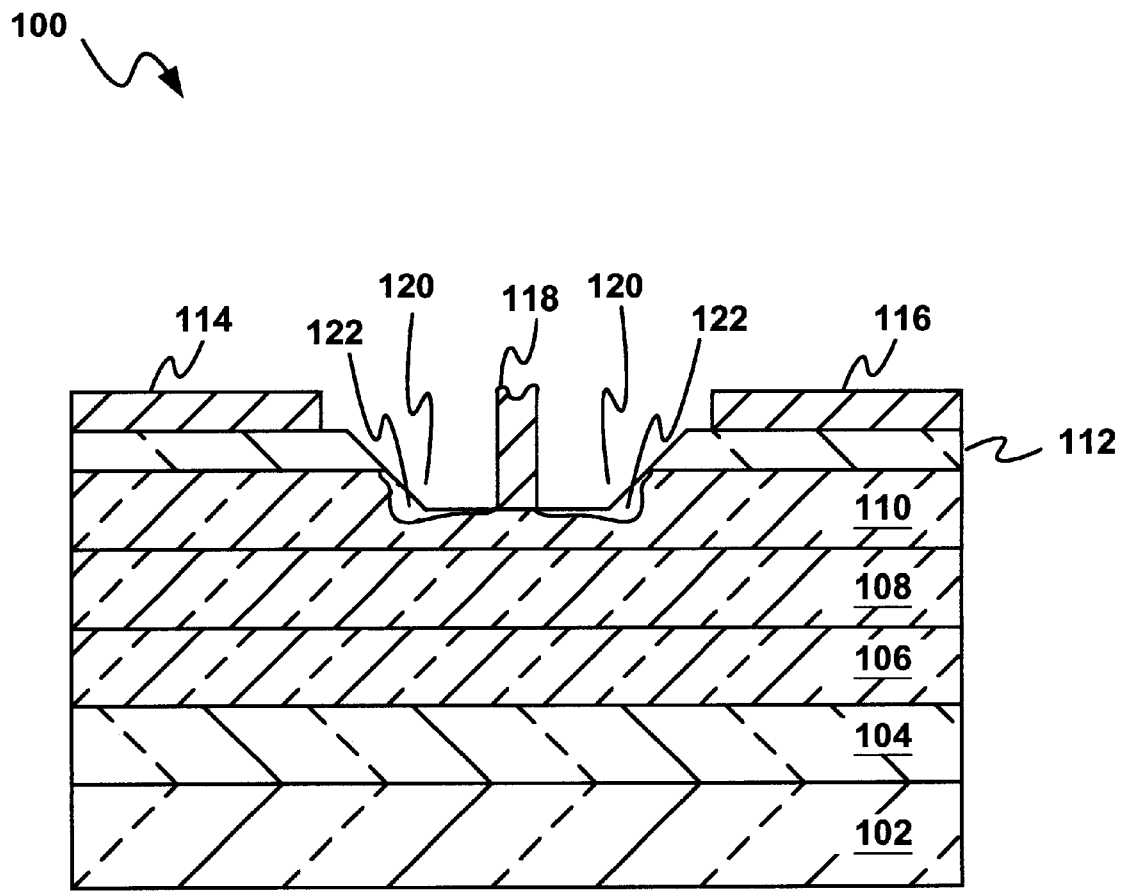
FIG. 1 (PRIOR ART) is a cross-section of a conventional, high electron mobility transistor (HEMT)

Referring now to FIG. 1 (PRIOR ART), therein is shown a cross-section of a conventional, high electron mobility transistor (HEMT) 100 in an intermediate stage of processing. At this stage is shown a substrate 102 with a channel layer 104 formed thereon. On top of the channel layer 104 is a spacer layer 106. A donor layer 108 is formed atop the spacer layer 106. A Schottky barrier layer 110 and a cap layer 112 are formed over the donor layer 108. A source 114 and a drain 116 are formed on the cap layer 112. A gate 118 is formed on the bottom of a recess 120 that extends through the cap layer 112 and at least partially through the Schottky barrier layer 110. The spacer, donor and Schottky barrier layers 106, 108, and 110, respectively, are typically formed of a "wide" band-gap semiconductor material, which is typically an aluminum-containing material such as aluminum indium arsenide (AlIAs), aluminum gallium arsenide (AlGaAs), or aluminum gallium antimonide (AlGaSb). The channel and cap layers 104 and 112, respectively are formed of a "narrow" band-gap material, which is typically a substantially aluminum-free material such as gallium arsenide (GaAs) or gallium indium arsenide (GaInAs). As explained in the BACKGROUND ART, a major problem with the conventional HEMT structure is that the wide band-gap material which forms the donor and Schottky barrier layers 108 and 110 typically includes a component such as aluminum which makes the device prone to degradation. The reference numeral 122 denotes areas in which the Schottky barrier layer 110 is degraded. The degradation results in a substantial reduction of the channel current that is highly undesirable.

The present invention provides a HEMT structure with a degradation-stop layer that would prevent the degradation of the Schottky barrier layer and the donor layer of the HEMT while minimizing any increase in the gate leakage current.

Figure 2:
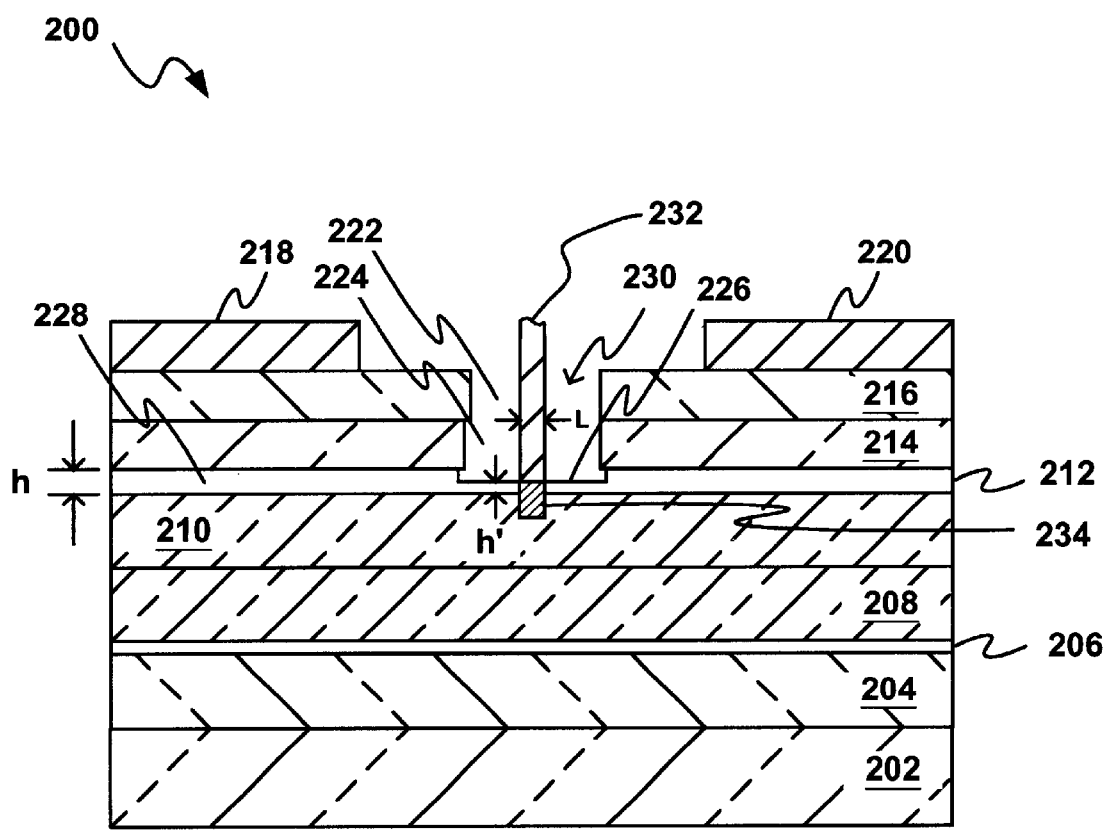
FIG. 2 is a cross-section of a HEMT formed in accordance with the present invention.

Referring now to FIG. 2, therein is shown the cross-section of a HEMT 200 constructed in accordance with the present invention. The HEMT 200 is in an intermediate stage of processing. At this stage is shown a substrate 202, which may have a buffer layer (not shown) formed thereon. A channel layer 204 is formed over the buffer layer. On top of the channel layer 204 is a spacer layer 206. A donor layer 208 is formed atop the spacer layer 206. A Schottky barrier layer 210 is formed over the donor layer 208. On top of the Schottky barrier layer 210 is a degradation-stop layer 212. An etch stop layer 214 is formed over the degradation-stop layer 212. A cap layer (contact layer) 216 is formed atop the etch stop layer 214. A source 218 and a drain 220 are associated with the contact layer 216 being formed on, alloyed into, or alloyed through the contact layer 216. The contact layer 216 includes a first opening 222 formed therethrough. The etch stop layer 214 includes a second opening 224 formed therethrough. The first opening 222 and second opening 224 are in substantial alignment with each other and expose a portion 226 of the degradation-stop layer 212. The exposed portion 226 of the degradation-stop layer 212 has a thickness of h', while the remaining, unexposed portion 228 of the degradation-stop layer 212 has a thickness of h, where h' is smaller than h. The first opening 222 and the second opening 224 form a gate trough 230 with the bottom of the trough passivated by the exposed portion 226. A gate 232 extends down through the first opening 222, and the second opening 224. A lower portion 234 of the gate 232 extends through the exposed portion 226 of the degradation-stop layer 212 and is in physical and electrical contact with the Schottky barrier layer 210. The portion of the gate 232 that extends through the first and second openings 222 and 224, and into the Schottky barrier layer 210 has a length of L and a width of W (not shown).

In a preferred embodiment, the substrate 202 is formed of a suitable material such as GaAs, GaInAs, or indium phosphide (InP). The spacer, donor and Schottky barrier layers 206, 208, and 210, respectively, are formed of a wide band-gap semiconductor material that is typically an aluminum-containing material, such as AliMAs, AlGaAs, AlInSb, or AlGaSb. The channel layer 204 is formed of a charge transport material, such as GaInAs. The contact layer 216 is formed of a narrow band-gap material which is typically a substantially aluminum-free material, such as GaInAs. The etch stop layer 214 is formed of a material such as GaAs. The degradation-stop layer 212 is formed of a substantially aluminum-free material such as GaInAs, InGaP, GaP, InP, GaAs, a compound thereof, an alloy thereof, and a combination thereof.

In a preferred embodiment, the lower portion 234 of the gate 232 includes a material selected from the group consisting of platinum (Pt), palladium (Pd), arsenic (As), antimony (Sb), phosphorous (P), a compound thereof, an alloy thereof, and a combination thereof. The upper portion of the gate 232 may include titanium (Ti), Pt, gold (Au), a compound thereof, an alloy thereof, and a combination thereof. The gate 232 has been sintered completely through the exposed portion 226 of the degradation-stop layer 212 and stopped in the Schottky barrier layer 210. Sintering of the gate 232 minimizes the problem of the adjacent semiconductor surface limiting the current and performance by making the lower portion 234 of the gate 232 extend through the degradation-stop layer 212 to physically and electrically contact the Schottky barrier layer 210.

The degradation-stop layer 212 prevents the degradation of the Schotttty barrier layer 210 and the donor layer 208 of the HEMT 200. In addition, since the gate 232 only contacts with the substantially aluminum-free degradation-stop layer 212 over an area of 2×W×h', while the main surface part of lower portion 234 of the gate 232 contacts the wide band-gap Schottky barrier layer 210 over an area of W×L, any increase in gate leakage current is minimized.

In a preferred embodiment, the respective thicknesses of the channel layer 204, the spacer layer 206, the donor layer 208 and the Schottky barrier layer 210 are about 125 Å, 20 Å, 80 Å, and 100 Å, respectively. The respective thicknesses of the degradation-stop layer 212, the etch stop layer 214 and the contact layer 216 are about 10 Å, 60 Å, 80 Å, respectively. However, these values are exemplary and not to be construed as limiting the scope of the invention.

Therefore, the present invention provides a HEMT structure with a degradation-stop layer that would prevent the degradation of the underlying Schottky barrier layer and the donor layer of the HEMT while minimizing any increase in the gate leakage current.

In production of the present invention, a conventional molecular beam epitaxy (MBE) process is used to provide a buffer layer (not shown), a channel layer 204, a spacer layer 206, a donor layer 208, a Schottky barrier layer 210, a degradation stop layer 212, an etch stop layer 214, and a contact layer 216 over a GaAs, InP, or InGaAs substrate 202 (FIG. 2). Alternative growth methods, such as Organo-Metallic Vapor Phase Epitaxy (OMVPE), are also feasible.

The gate 232 is defined by direct e-beam writing in a trilayer resist (not shown), then the conventional resist development, metal evaporation, and lift-off processes are performed. Other well-known methods for defining ultra short gates include angle evaporation, self-limiting oxide spacer self-alignment, and phase-shifting techniques.

In a preferred embodiment, the gate 232 includes a metal stack formed of 4500 Å Au/200 Å Ti/200 Å Pt/300 Å Ti/25 Å Pt. Prior to the sintering process, the bottom portion 25 Å Pt is formed atop the degradation-stop layer 212. Next, sintering of the gate 232 is performed at a temperature of about 300° C. for about 30 minutes. Sintering of the gate 232 causes the bottom portion 25 Å Pt to react with degradation-stop layer to form a lower portion 234 of the gate 232. The lower portion 234 of the gate 232 extends through the degradation-stop layer 212 into the Schottky barrier layer 210. Because of the scaling between the bottom portion Pt thickness and sintering depth, the bottom portion Pt thickness must be limited. It should be noted that the degradation-stop layer 212 should be thinner than the sintering depth.

Prior to the gate 232 formation, the first and second openings 222 and 224 were formed using a two-step selective etch process. In the preferred embodiment, succinic-acid based etch is first used to remove the contact (GaInAs) layer 216 at a rate that is 10–20 times higher than in the underlying contact etch stop (GaAs) layer 214. This allows for sufficient lateral etch of the contact layer 216 before the etch stop layer 214 is consumed. Next, an ammonium hydroxide based etch is used to remove the etch stop layer 214. It consumes what is left of the etch stop layer 214 and stops in the underlying degradation-stop layer 212.

Besides acting as a degradation barrier for the Schottky barrier layer 210 and/or the donor layer 208, the degradation-stop layer 212 also functions as an etch stop layer for the etching of the etch stop layer 214. The exposed portion 226 of the degradation-stop layer 212 is partially etched away during the etching of the etch stop layer 214 to form the second opening 224, leaving a thickness of h'.

Therefore, in accordance with the present invention, a HEMT structure is provided with a degradation-stop layer that would prevent the degradation of the underlying Schottky barrier layer and/or the donor layer of the HEMT while minimizing any increase in the gate leakage current.

Although the embodiments of the present invention are directed to using AlInAs and AlGaAs for the spacer, donor, and Schottky barrier layers, it should be understood that the present invention is applicable to other aluminum-containing wide band-gap semiconductor materials. Also, alternative materials exist for the degradation stop layer, such as InP, GaAs, GaP, InAs, GaSb, InSb, a compound thereof, an alloy thereof, and a combination thereof.

While the best mode utilizes a contact layer and a contact etch stop layer, it should be understood that the present invention is applicable to transistors without such contact layers and/or contact etch stop layers.

In summary, the sintered lower portion 234 of the gate 232 comprises materials from a group consisting of platinum, palladium, gallium, indium, arsenic, antimony, phosphorous, compounds thereof, alloys thereof, and combinations thereof. The substrate 202 comprises materials from a group consisting of gallium, indium, arsenic, phosphorous, compounds thereof, alloys thereof, and combinations thereof The channel layer 204 comprises materials from a group consisting of gallium, indium, arsenic, antimony, phosphorous, compounds thereof, alloys thereof, and combinations thereof. The aluminum-containing materials comprise materials from a group consisting of aluminum, indiumn, gallium, arsenic, antimony, phosphorous, compounds thereof, alloys thereof, and combinations thereof And, the substantially aluminum-free materials comprises materials from a group consisting of gallium, indium, arsenic, antimony, phosphorous, compounds thereof, alloys thereof, and combinations thereof.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A transistor structure comprising:
    a substrate;
    a channel layer formed of a charge transport material over said substrate;
    a Schottky barrier layer formed of an aluminum-containing material over said channel layer;
    a degradation-stop layer formed of a substantially aluminum-free material over said Schottky barrier layer; and
    a source, a drain and a gate, said source and said drain being formed in association with said channel layer, a lower portion of said gate is sintered into and extends down through an exposed portion of said degradation-stop layer and is in physical and electrical contact with said Schottky barrier layer.

2. The transistor structure as claimed in claim 1 wherein said lower portion of said gate comprises a material selected from a group consisting of platinum, palladium, aluminum, gallium, indium, arsenic, antimony, phosphorous, a compound thereof, an alloy thereof, and a combination thereof.

3. The transistor structure as claimed in claim 1 wherein said substrate comprises a material selected from a group consisting of gallium, indium, arsenic, phosphorous, a compound thereof, an alloy thereof, and a combination thereof.

4. The transistor structure as claimed in claim 1 wherein said charge transport material comprises a material selected from a group consisting of aluminum, gallium, indium, arsenic, antimony, phosphorous, a compound thereof, an alloy thereof, and a combination thereof.

5. The transistor structure as claimed in claim 1 wherein said aluminum-containing material comprises a material selected from a group consisting of aluminum, indium, gallium, arsenic, antimony, phosphorous, a compound thereof, an alloy thereof, and a combination thereof.

6. The transistor structure as claimed in claim 1, further comprising a contact layer over said degradation-stop layer, and said source and drain being associated with said contact layer.

7. The transistor structure as claimed in claim 6, further comprising an etch-stop layer between said contact layer and said degradation-stop layer.

8. The transistor structure as claimed in claim 6, further comprising an opening formed in said contact layer, said opening exposes said exposed portion of said degradation-stop layer, wherein said gate extends down through said opening to contact said Schottky barrier layer.

9. A transistor structure comprising:
    a substrate;
    a channel layer formed of a charge transport material over said substrate;
    a Schottky barrier layer formed of an aluminum-containing material over said channel layer;
    a degradation-stop layer formed of a substantially aluminum-free material over said Schottky barrier layer;
    a contact layer formed of a substantially aluminum-free material over said degradation-stop layer, said contact layer including a first opening formed therethrough and exposes a portion of said degradation-stop layer; and
    a source, a drain and a gate, said source and said drain being formed in association with said contact layer, said gate extends down through said first opening, and a lower portion of said gate is sintered into and extends down through said exposed portion of said degradation-stop layer and is in physical and electrical contact with said Schottky barrier layer.

10. The transistor structure as claimed in claim 9 wherein said lower portion of said gate comprises a material selected from the group consisting of platinum, palladium, aluminun, gallium, indium, arsenic, antimony, phosphorous, a compound thereof, an alloy thereof, and a combination thereof.

11. The transistor structure as claimed in claim 9 wherein said substrate comprises a material selected from a group consisting of gallium arsenide, gallium indium arsenide, indium phosphide, a compound thereof, an alloy thereof, and a combination thereof.

12. The transistor structure as claimed in claim 9 wherein said substantially aluminum-free material comprises a material selected from a group consisting of gallium indium arsenide, gallium arsenide, gallium antimonide, gallium phosphide, indium arsenide, indium antimonide, indium phosphide, a compound thereof, an alloy thereof, and a combination thereof.

13. The transistor structure as claimed in claim 9 wherein said aluminum-containing material comprises a material selected from a group consisting of aluminum indium arsenide, aluminum gallium arsenide, aluminum phosphide, a compound thereof, and an alloy thereof, and a combination thereof.

14. The transistor structure as claimed in claim 9, further comprising an etch-stop layer between said contact layer and said degradation-stop layer, said etch-stop layer including a second opening formed therethrough, said second opening is substantially aligned with said first opening and exposes said exposed portion of said degradation-stop layer.

15. A method for forming a transistor structure, comprising the steps of:

providing a substrate;

forming a channel layer over said substrate, said channel layer being formed of a charge transport material;

forming a Schottky barrier layer over said channel layer, said Schottky barrier layer being formed of an aluminum-containing material;

forming a degradation-stop layer over said Schottky barrier layer, said degradation-stop layer being formed of a substantially aluminum-free material; and forming a source, a drain and a gate associated with said channel layer, sintering said gate until a lower portion of said gate extends down through an exposed portion of said degradation-stop layer and is in physical and electrical contact with said Schottky barrier layer.

16. The method as claimed in claim 15 wherein said lower portion of said gate comprises a material selected from the group consisting of platinum, palladium, aluminum, gallium, indium, arsenic, antimony, phosphorous, a compound thereof, an alloy thereof, and a combination thereof.

17. The method as claimed in claim 15 including the step of forming a contact layer over said degradation-stop barrier layer prior to the step of forming said source and said drain, wherein said source and said drain are formed in association with said contact layer.

18. The method as claimed in claim 17 including the step of forming an opening in said contact layer, said opening exposes said exposed portion of said degradation-stop layer, wherein said gate extends down through said opening to contact said Schottky barrier layer.

19. The method as claimed in claim 15 wherein said substantially aluminum-free material is selected from a group consisting of gallium arsenide, gallium antimonide, gallium phosphide, indium arsenide, indium antimonide, indium phosphide, a compound thereof, an alloy thereof, and a combination thereof.

20. The method as claimed in claim 15 wherein said aluminum-containing material comprises a material selected from a group consisting of aluminum, gallium, indium, arsenic, antimony, phosphorous, a compound thereof, an alloy thereof, and a combination thereof.

* * * * *